United States Patent [19]

Ohtsuka et al.

[11] Patent Number: 6,128,868
[45] Date of Patent: *Oct. 10, 2000

[54] COMBINATION SOLAR BATTERY AND ROOF MEMBER, AND MOUNTING METHOD THEREOF

[75] Inventors: Takashi Ohtsuka, Kyotanabe; Kimitoshi Fukae, Nara; Akiharu Takabayashi, Nara; Toshihiko Mimura, Nara; Masahiro Mori, Kyoto, all of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/922,533

[22] Filed: Sep. 3, 1997

[30] Foreign Application Priority Data

Sep. 6, 1996 [JP] Japan .................................. 8-236567

[51] Int. Cl.7 .................................................. E04D 13/18
[52] U.S. Cl. ........................ 52/173.3; 136/251; 136/259
[58] Field of Search .................................. 136/251, 256, 136/259; 52/173.3

[56] References Cited

U.S. PATENT DOCUMENTS 5,409,549  4/1995  Mori ........................................ 136/244
5,497,587  3/1996  Hirai et al. .............................. 136/251
5,524,401  6/1996  Ishikawa et al. ....................... 136/251

FOREIGN PATENT DOCUMENTS 9312518.6  11/1993  Germany .
6-69527    3/1994   Japan .
6-140656   5/1994   Japan .
7-153985   6/1995   Japan .
7-302924   11/1995  Japan .
2661427    6/1997   Japan .

*Primary Examiner*—John Goodrow
*Attorney, Agent, or Firm*—Fitzpatrick, Cella, Harper & Scinto

[57] ABSTRACT

A roof member includes a solar battery module in which a solar battery element is fixed on a backing, with two opposite sides of the backing of the solar battery module bent to form an eaves-side connecting portion and a ridge-side connecting portion, and wherein the ridge-side connecting portion is open on the front surface side of roof member, and electrical wiring is provided in the ridge-side connecting portion. A plurality of such roof members are horizontally connected with each other by a joint drip plate, and a joint cover and wires of the respective roof members are connected with each other in the ridge-side connection portion. The eaves-side connecting portion and the ridge-side connecting portion of the respective roof members are seam-jointed with each other, and wires of the respective roof members are connected with each other in the ridge-side connecting portion.

86 Claims, 10 Drawing Sheets

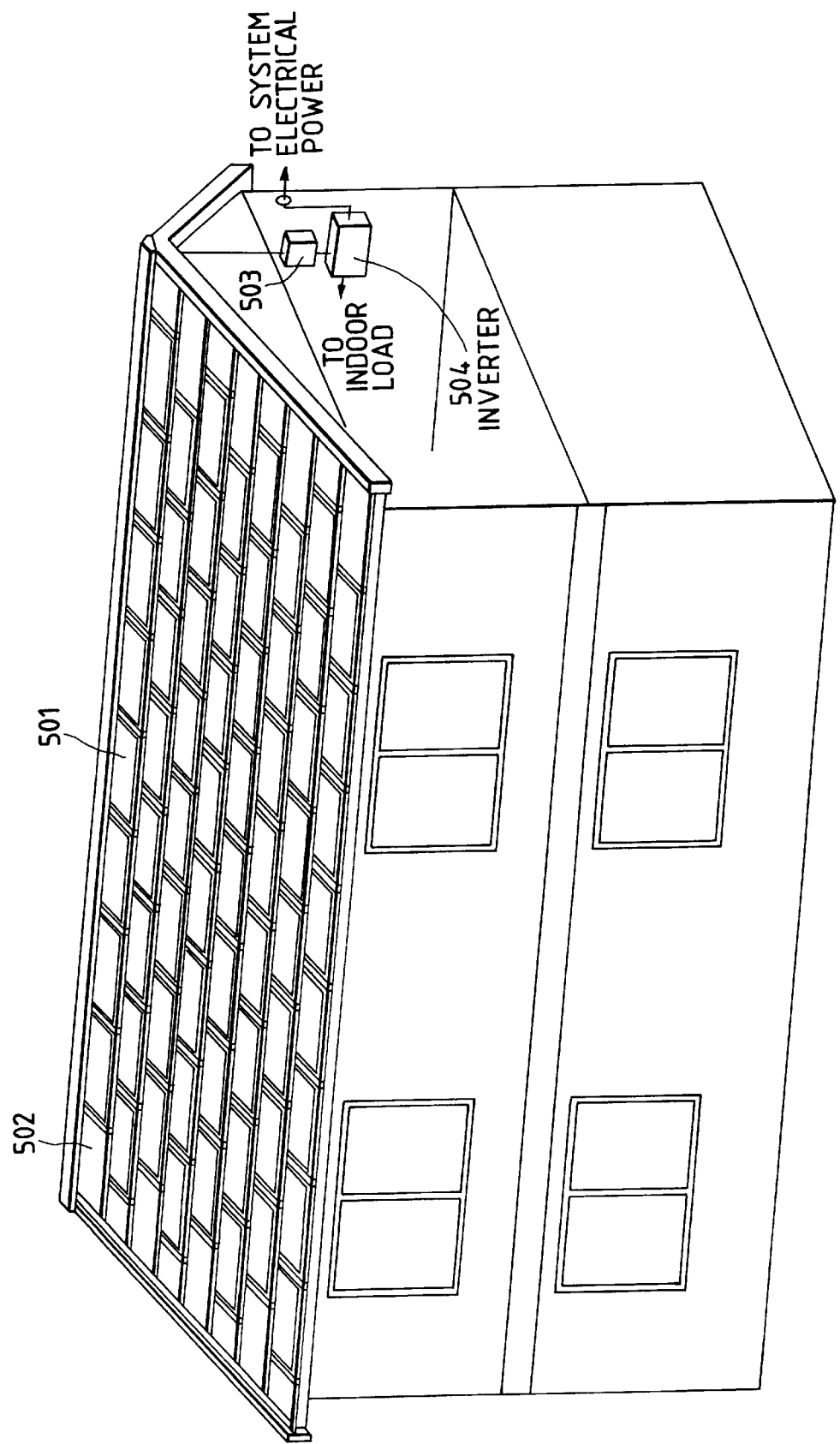

COMBINATION SOLAR BATTERY AND ROOF MEMBER, AND MOUNTING METHOD THEREOF

BACKGROUND OF THE INVENTION

1. Field of the Invention

The present invention relates to a combination solar battery and roof member and a mounting method of roof the member using it.

2. Related Background Art

Combination solar battery and roof members obviate the need for use of frames and permit great reduction of costs, because mounting work of the solar battery is carried out as part of construction work of the building.

The structure of conventional combination solar battery and roof members is a solar battery module in which a weather-resistant film is used as a protecting member on the front surface side, a reinforcing plate is attached to the back surface without using a frame at the circumference, and the reinforcing plate is processed by plastic working.

The conventional, horizontal-roofing combination solar battery and roof members, however, had the following problems, because junction boxes were present on the back surface of the roof member.

(1) If a problem arises in wiring of the solar battery, it will be impossible to conduct detection and repair.

(2) Since it is necessary to carry out cable connection work at the same time as roofing of the roof member, workers unfamiliar with the solar batteries sometimes omit connection of wiring or conduct erroneous connection. This will result in failing to obtain the expected output because of the wiring, though there is nothing wrong with the combination solar battery and roof members per se.

(3) When one module becomes defective among the solar battery modules after they are mounted, the defective module cannot be found, because it is not possible to measure performance of the solar battery module one by one.

(4) As a problem in mountability, the wiring work with fixing the roof member takes a lot of time, because it is impossible to carry out the wiring work after fixation.

An idea as to the electric connection between solar batteries in the laying form of horizontal-roofing shape is a method for electrically connecting them by use of electrically conductive rubber in overlapping and seam-jointed portions as in the invention disclosed in Japanese Patent Publication No. 5-31832. This method, however, possibly has problems that connection is permitted only between roof members vertically adjacent to each other, that long-term reliability is doubtful, because the rubber is used for connection between connecting portions required to have strength and hermeticity, that electrical insulation is a little uncertain under wet conditions, and so on.

Japanese Laid-open Patent Application No. 6-69527 discloses the invention as to the solar battery module permitting the wiring work even after mounted, but, because it uses a frame member with a space of a pipe shape for passage of wire, it has a problem of increase of cost, a problem of poor appearance, and so on.

Japanese Laid-open Patent Application No. 6-140656 describes that connectors enabling to simultaneously effect electrical connection and mechanical connection between upper and lower roof members are placed in a space formed in the seam-jointed portion. However, such connection is possible only between roof panels vertically adjacent to each other. In addition, no consideration is given to check of wiring after mounting.

As described above, strong demands exist for combination solar battery and roof members excellent in flashing, strength, and appearance, adopting the successively and partly overlapping mount form and permitting easy electrical wiring work even after fixation of the roof member.

SUMMARY OF THE INVENTION

A roof member of the present invention is a roof member comprising a solar battery module in which a solar battery element is fixed on a backing, wherein two opposite sides of the backing are bent to form an eaves-side connecting portion and a ridge-side connecting portion, wherein the ridge-side connecting portion is open on the front surface side of the roof member, and wherein electrical wiring is given in the ridge-side connecting portion.

A plurality of such roof members are horizontally connected with each other by joint drip plate and joint cover and wires of the respective roof members are connected in the aforementioned ridge-side connecting portion. The eaves-side connecting portion and the ridge-side connecting portion of the respective roof members are seam-jointed with each other and wires of the respective roof members are connected with each other in the ridge-side connecting portion. Particularly, the aforementioned ridge-side connecting portion is covered by a cover for a wiring receiving portion.

According to the present invention, wiring can be installed without a prominent appearance. When the level difference of connecting portion is utilized, the wiring can be set therein without unwanted unevenness in a surface panel portion of roof member. Therefore, the present invention enables the wires on the front surface of the roof to leave a preferred appearance similar to those of the conventional horizontal-roofing roofs. Since the electrical wires can be installed without a decrease in a light receiving surface of the solar battery element, the solar batteries can be mounted on the roof surface with good area efficiency.

Since the present invention obviates the need for wiring on the back side of the roof member, the electric wiring does not have to be conducted at the same time as the fixation of the roof member. As a consequence, different works of the fixation of the roof member and the electrical wiring can be carried out as separate steps, which improves workability upon installation.

The roof member is comprised of a back reinforcing plate, a solar battery element, a filling material for filling the solar battery element, and a surface film, which can realize incorporation of solar battery and roof member with high reliability and which permits the roof member to be made with high processability and at low cost.

BRIEF DESCRIPTION OF THE DRAWINGS

FIG. 11 is a drawing to show an appearance where the roof members in the embodiment are mounted.

DESCRIPTION OF THE PREFERRED EMBODIMENTS

<Embodiment 1>

(Shape of Roof Member)

Figure 1:
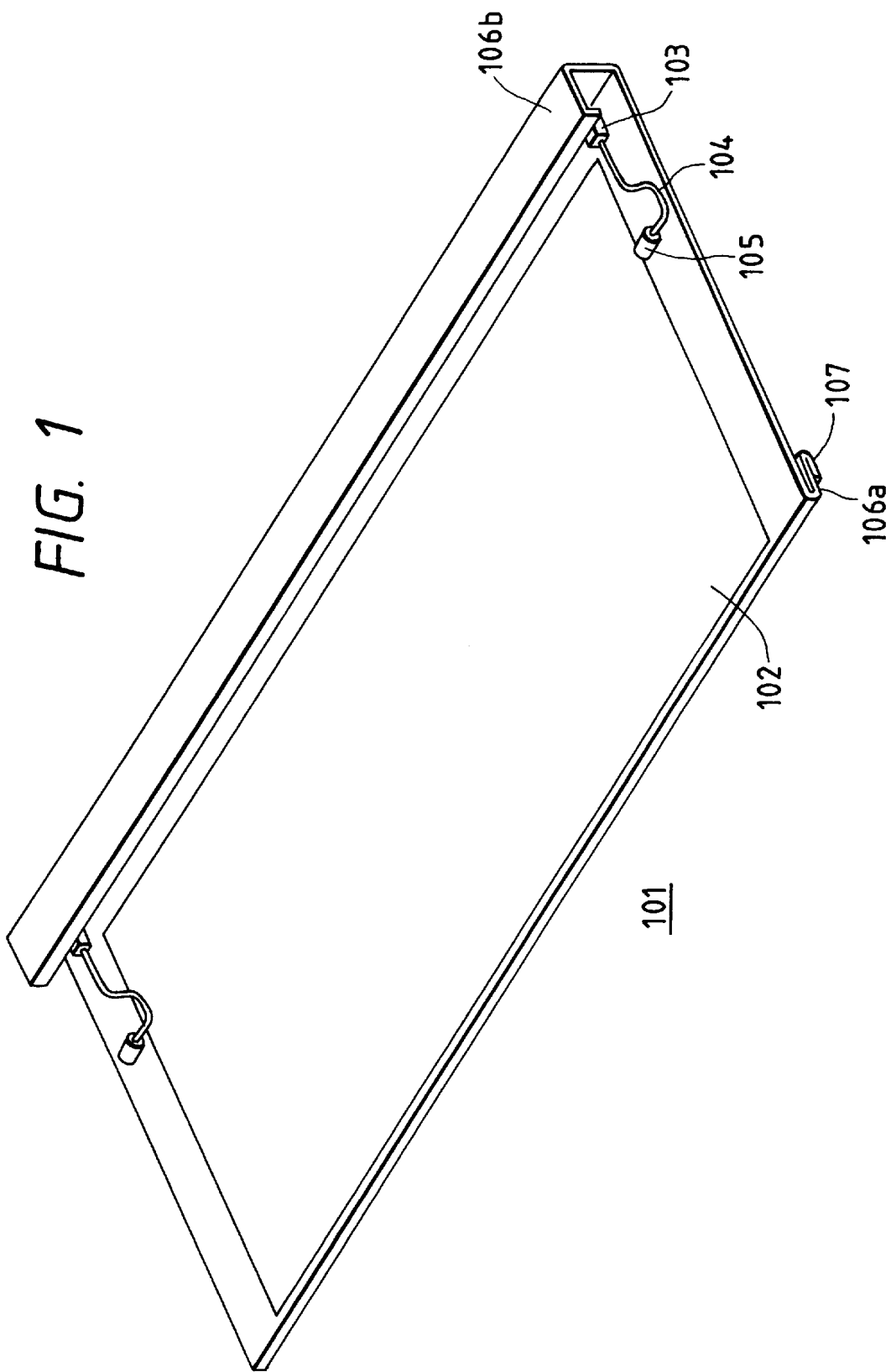
FIG. 1 is a drawing to show an appearance of the roof member of Embodiment 1.

FIG. 1 is a drawing to show the appearance of the roof member according to the present embodiment. The roof member 101 has solar battery element 102 on the front surface thereof and is bent as illustrated. Specifically, the roof member 101 has a U-shaped eaves-side connecting portion 106a at the end located on the eaves side when mounted on the roof, and it further has an inserting portion 107 for insertion of wiring receiving portion cover folded back toward the outside.

On the other hand, at the end located on the ridge side, the roof member has the ridge-side connecting portion 106b bent to stand up on the front side and further folded back toward the eaves side at the edge thereof.

The ridge-side connecting portion 106b has a space bent in the U-shape and junction boxes 103 to each of which cable 104 with connector 105 is connected are attached in the space. The space is open to the outside. An output line of solar battery element 102 is connected to the cable 104 inside the junction box 103.

(Details of Connecting Portions)

Figure 2:
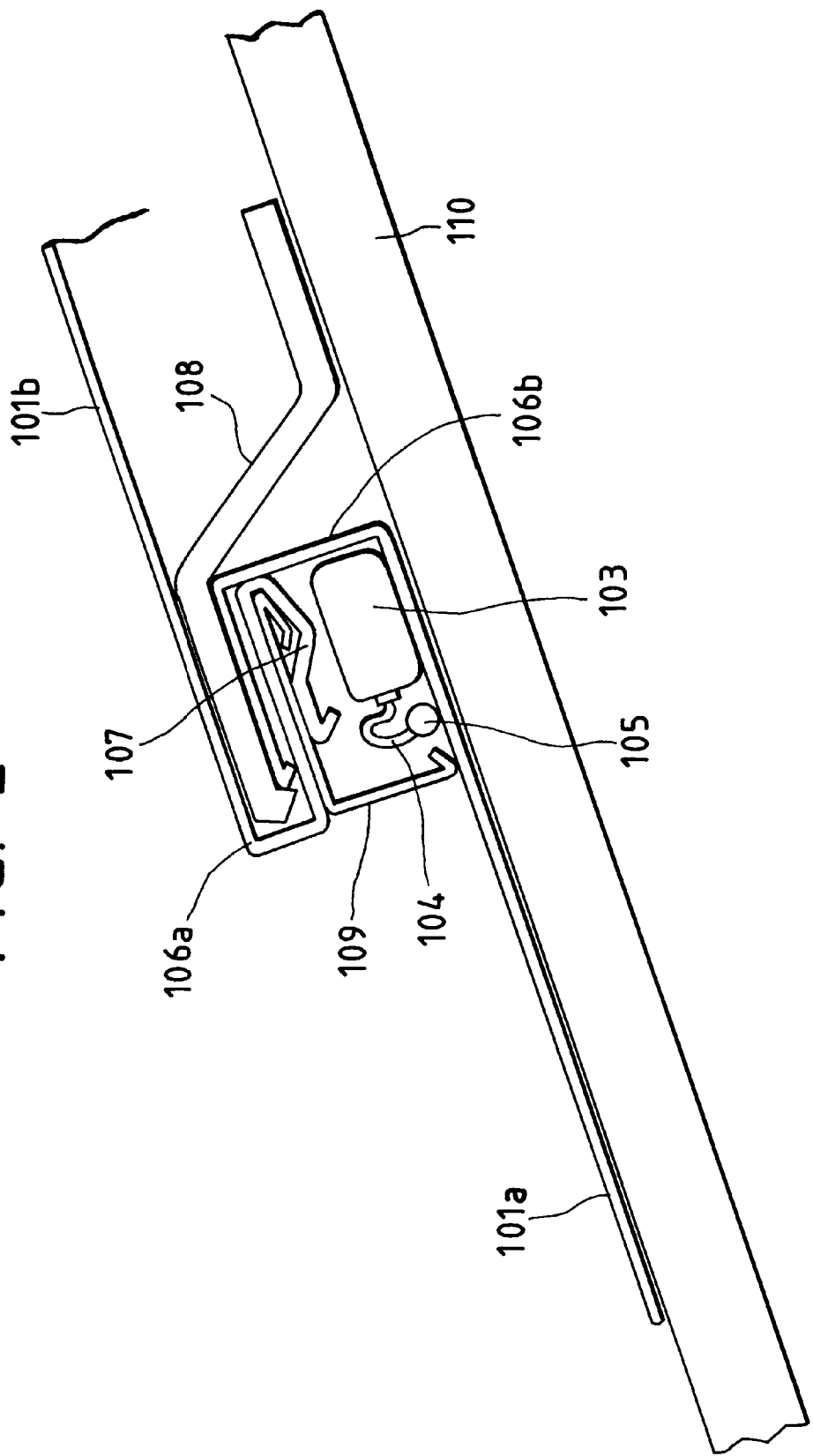
FIG. 2 is a schematic, cross-sectional, structural drawing to show the region near the engaging portions and wiring receiving portion in the roof members of Embodiment 1.

A cross-sectional view of the connecting portions is shown in FIG. 2.

The ridge-side connecting portion 106b of roof member 101a is fixed by retaining clip 108 on sheathing roof board 110. The eaves-side connecting portion 106a of another roof member 101b is seam-jointed with the end of the ridge-side connecting portion 106b of the roof member 101a. The junction boxes 103 to each of which the cable 104 with connector 105 is connected are mounted in the ridge-side connecting portion 106b of roof member 101a. For protecting these electric components from wind, rain, etc., L-shaped protection cover 109 for protecting the wiring receiving portion is fit in the inserting portion 107 for insertion of protection cover for wiring receiving portion.

(Mounting Method)

Figure 3:
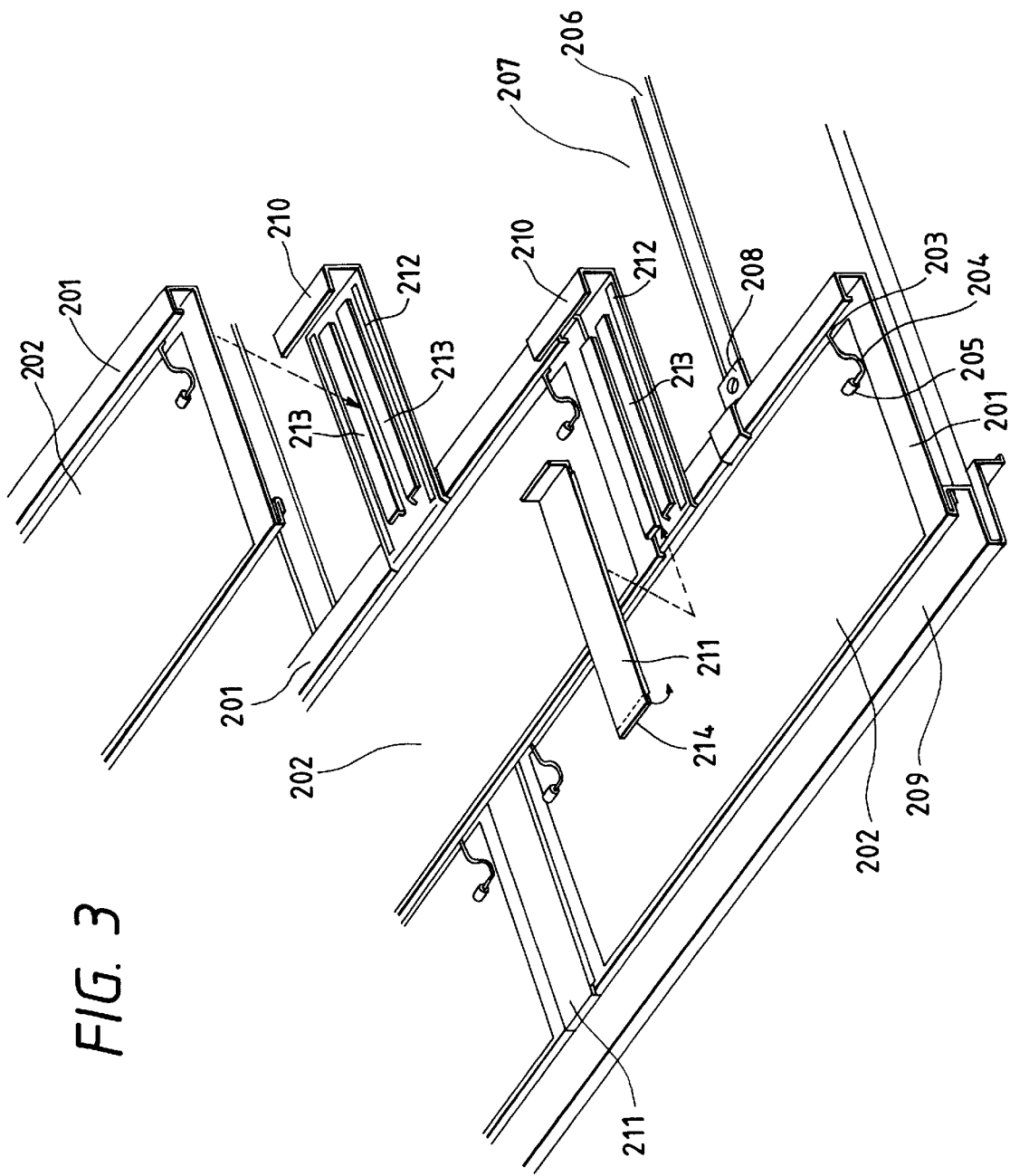
FIG. 3 is a schematic, perspective view to show the construction in mounting of the roof members of Embodiment 1.

FIG. 3 shows the mounting method of the roof member of the present embodiment.

1. Connection in the horizontal direction and in the direction toward the ridge (1) A plurality of rafters 206 are fixed onto purlins and sheathing roof boards 207 are fixed between the rafters.

(2) The roof members 201 closest to the eaves engage with eave arabesque 209 with the eaves-side connecting portion being laid from above it and the ridge-side connecting portions of the roof members 201 are fixed by the retaining clips 208.

(3) A connecting part between two horizontally arranged roof members 201 is interposed between joint drip plate 210 and joint cover 211. The joint drip plate 210 has waterproofing seals 212 at overlapping portions so as to prevent water from intruding through a gap between the drip plate 210 and the roof member 201. It also has engaging portions 213 to engage with the joint cover 211.

(4) The joint cover has portions folded back to the inside in the U-shape at the right and left edges. The joint cover 211 is mounted as being slid from the eaves side to the ridge side so that the right and left folded portions of the joint cover come to engage with the engaging portions 213 of the joint drip plate 210. The ridge-side edge of the joint cover 211 is bent so as to stand up and to be kept by the roof members adjacent on the ridge side. The eaves-side edge 214 of joint cover 211 is kept almost horizontal before a finish cover (not illustrated) described below is inserted between the joint cover and the engaging portions 213. After the finish cover is inserted deeply, the lower edge is bent so as to prevent the finish cover from slipping down. For removing the finish cover, the joint cover edge 214 is unbent back into the nearly horizontal state.

(5) After the roof members 201 horizontally arranged on a line are fixed, the eaves-side connecting portions of roof members 201 in the next ridge-side line are successively connected with the ridge-side connecting portions of adjacent roof members on the eaves side.

(6) Then connectors 205 of solar battery roof members 201 are connected.

2. Electrical Connection at Gable Edge

Connection of roof members set at the gable edge will be described.

Figure 4:
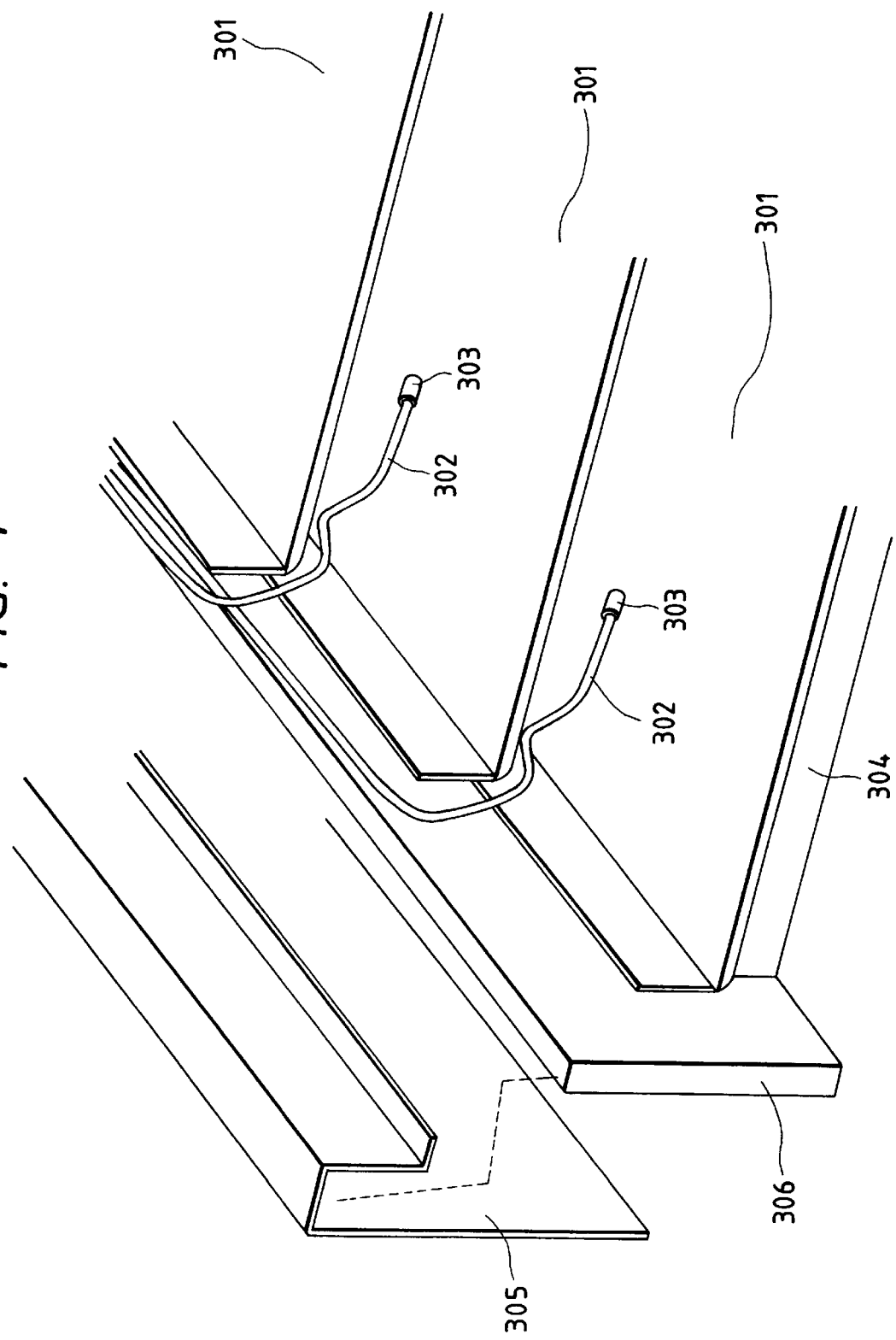
FIG. 4 is a schematic, perspective view to show the construction in mounting of the cover for wiring receiving portion of Embodiment 1.

FIG. 4 is a schematic, perspective view of the structure near the gable finish of roof member according to the present embodiment.

The roof members closest to the gable, or dummy plates 301 are bent at the gable-side end thereof so as to match bargeboard 306. The bargeboard 306 is covered by gable cover 305. Leading-in cables 302 for leading the power of solar battery into the house are placed in the gable cover 305.

The cables 302 in the gable cover 305, if the number of serially connected solar batteries therein is sufficient, are wired up to the indoor switch board, and those necessitating further solar batteries connected in series are arranged to be connected with solar batteries in a vertically adjacent line. If a roof member to be connected is apart from the gable, an extension cable is used to connect it with the leading-in cable 302 preset at a predetermined position and extending from the gable cover. On that occasion the extension cable is routed inside the ridge-side connecting portions of horizontally arrayed roof members. The wiring of roof members is completed in this way.

3. Attachment of Finish Cover

Figure 5:
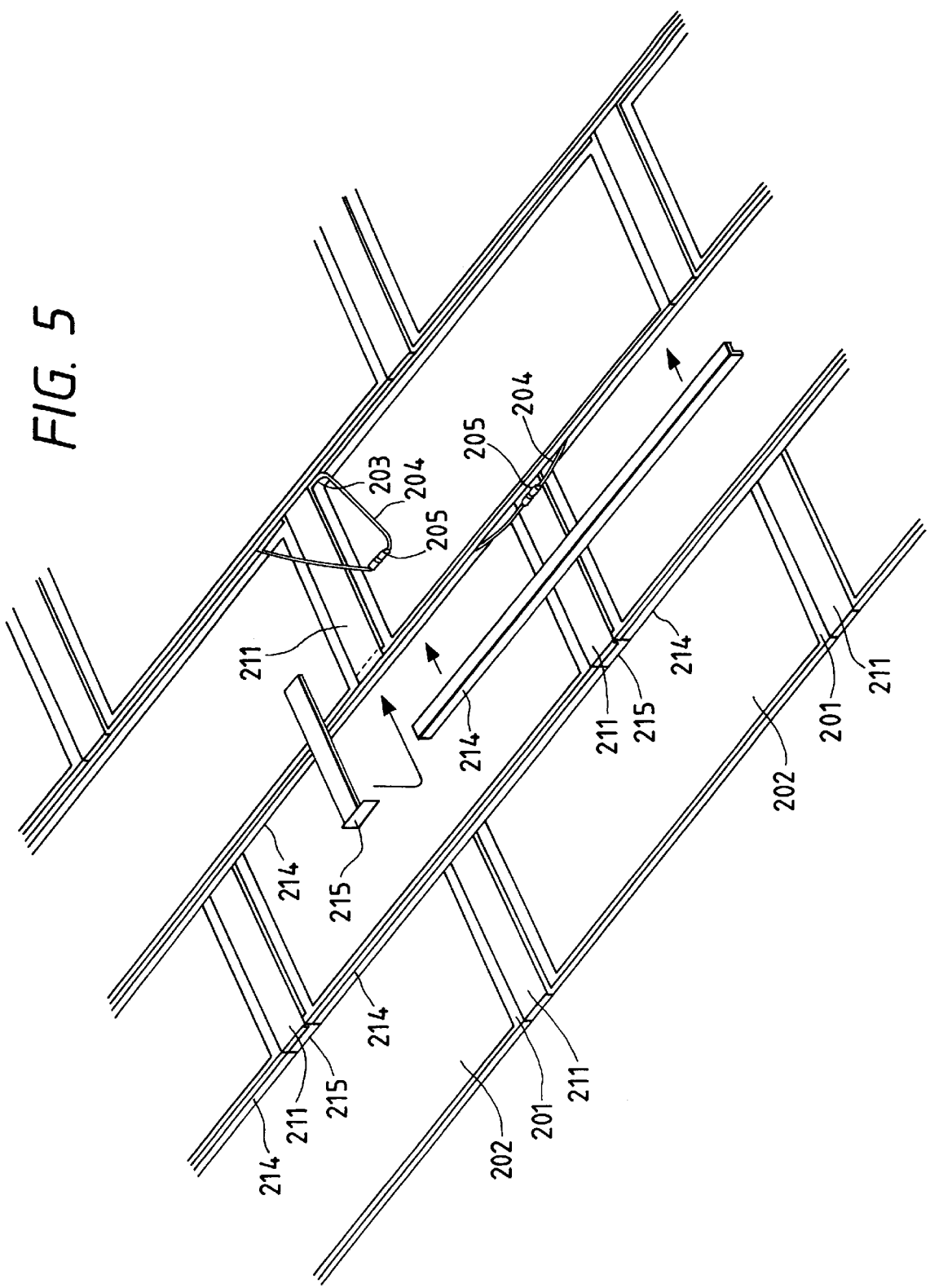
FIG. 5 is a schematic, perspective view of the construction near the gable finish of the roof members of Embodiment 1.

Finally, wiring receiving portion covers 214 and finish covers 215 are attached as shown in FIG. 5.

Each wiring receiving portion cover 214 is bent in the L-shape so as to form a portion to be inserted into the roof member and a portion for blindfold and protection of wires received therein.

The cables 204 connected with each other through connectors 205 are pressed into the ridge-side connecting portions and one side of the wiring receiving portion cover 214 is inserted into the cover inserting portion for insertion of the wiring receiving portion cover provided at the eaves-side end of roof member 201. The cover is detachable, which facilitates maintenance and inspection of wiring.

Then the finish cover 215 is attached. The cover is inserted as being slid into the gap between the joint cover 211 already fixed and the engaging portions 213 (see FIG. 3) existing below it. Then the eaves-side end of joint cover 211 is bent down at the dotted line portion in the figure, thereby preventing the finish cover 215 from slipping down. FIG. 11 shows a complete state wherein the roof members of the present embodiment are mounted.

In addition to the roof members 501, roof members without the solar battery bonded thereto, i.e., the dummy plates 502 are used at portions necessitating processing of gable finish part or the like. In this way, the roof members of the present invention can be mounted without sense of incompatibility even if they are roofed as mixed with ordinary metal roof members.

The wire members collected at the gable part are drawn into the house to be connected to the switch board 503. An electric power generation system is constructed in such an arrangement that inverter 504 is further connected to the switch board 503 and the power is sent to the system electrical power or is consumed at the indoor load.

Since the present invention realized the structure permitting the wiring work to be conducted from the front side of the roof member, workability of installation is improved and maintenance and inspection of wiring can be carried out easily. For example, when a failure occurs in a solar battery element in a series of roof members horizontally connected in series, the solar battery elements can be checked one by one readily. Once the defective roof member is specified, the electric connection at that part can be disconnected and temporary restoration can be done by connecting the roof members before and after the defective roof member with each other by cable.

The roof members of the present invention are also ready for complex wiring configurations meeting such a requirement of system as to connect the roof members located in the central portion directly to the switch board by placing the extension cable in the wiring receiving portions.

(Structure of Roof Member)

Figure 10:
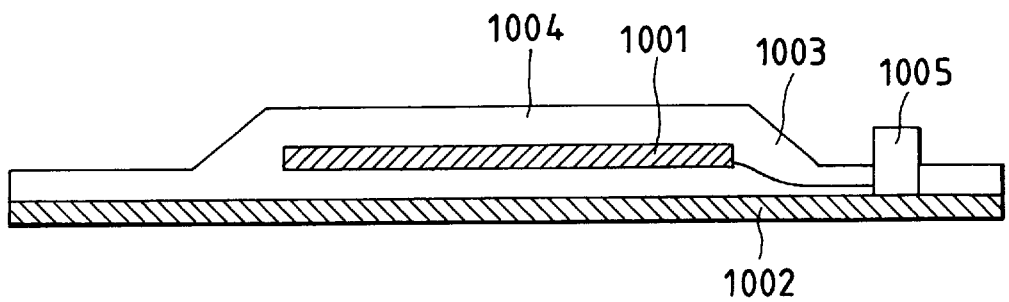
FIG. 10 is a schematic, cross-sectional, structural drawing of the roof member.

A schematic, cross-sectional, structural view of a roof member is shown in FIG. 10. In FIG. 10, reference numeral 1001 denotes a solar battery element, 1002 a backing, 1003 a surface film, and 1004 a filling material. Described in the following are the members constituting the combination solar battery and roof member and the roof member, and the members related to mounting thereof.

1. Members Constituting the Roof Material (1-1 Backing)

The material for the backing can be selected from steel sheets and nonferrous metal plates, similar to the conventional metal roofs.

Examples of the steel sheets include surface-treated or coated steel sheets, alloys thereof or special steels containing another element, and composite steel sheets laminated with a heat-insulating material or the like. More specifically, the material is selected from hot-dip galvanized steel sheets, galphan, galvanium steel sheets, hot-dip aluminized steel sheets, copper-plated steel sheets, polyvinyl chloride precoated steel plates, fluorocarbon resin steel sheets, stainless steel sheets, high damping steel sheets, heat-insulating galvanized sheet iron, atmosphere corrosion resisting steel sheets, and the aforementioned coated steel sheets. Specific examples of the nonferrous materials include copper sheets, aluminum alloy sheets, zinc alloy sheets, lead sheets, and titanium sheets.

(1-2 Solar Battery Element)

The solar cells used in the present invention may be of either form of single crystal, polycrystal, microcrystal, and amorphous form. In addition, they may be either of a silicon based material or of a compound based material.

Among others, the amorphous silicon solar cells are preferred for use on the roof, because they have flexibility and because they recover degradation thereof by heat.

Figure 9:
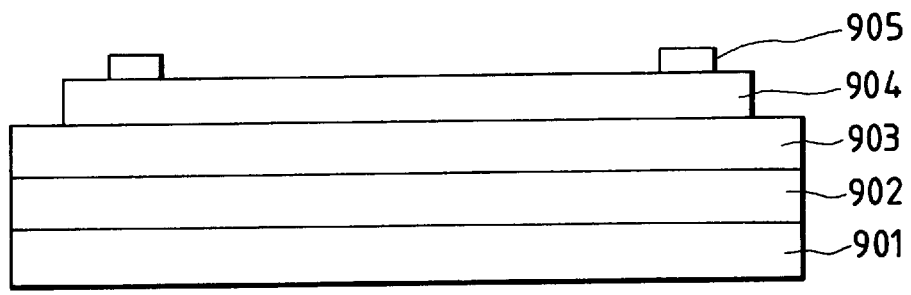
FIG. 9 is a schematic, cross-sectional, structural drawing of the solar battery element.

FIG. 9 is a cross-sectional view of an amorphous silicon solar cell as an example of the solar battery element preferably used in the present invention. The solar cell is constructed in the lamination structure of back reflecting layer 902, semiconductor layer 903, transparent conductive layer 904, and collector electrode 905 on substrate 901.

The material for substrate 901 is selected from metals such as stainless steel and resins such as polyimide.

Formed on the surface of substrate 901 is the metal layer 902 of aluminum, silver, or the like serving as an electrode and as a reflecting layer. A transparent conductive layer of zinc oxide or the like may be provided further on the metal layer.

The material for the semiconductor layer 903 is selected from amorphous silicon, amorphous silicon germanium, amorphous silicon carbon, and so on. The semiconductor layer 903 is made by the plasma enhanced CVD process, the thermal CVD process, the LPCVD process, the sputtering process, the vapor deposition process, or the like.

The transparent electrode of ITO or the like is provided on the semiconductor layer 903. The collector electrode comprised of conductive paste, metal wire, soldering, and the like is provided further on the transparent electrode.

(1-3 Filling Material)

Preferred examples of the filling material are EVA (ethylene-vinyl acetate), EEA (ethylene-ethylacrylate), PVB (polyvinyl butyral), and so on. Such materials may also be used in combination with a nonwoven glass fabric or inorganic particles of silica or the like. When the substrate of the solar battery element is electrically conductive, an insulating film of PET (polyethylene terephthalate) or the like needs to be interposed between the solar battery element 1001 and the backing 1002, for keeping electrical insulation to the backing 1002.

(1-4 Surface Film)

The material for the surface film 1003 is selected from tetrafluoroethylene TFE, tetrafluoroethylene-ethylene copolymers ETFE, polyfluorovinyl, polychlorofluoroethylene CTFE, and so on. These may be used with an additive of ultraviolet absorber. For enhancing adhesion to the filling material, the surface of the surface film may be roughened by a corona discharge treatment or the like. The surface film is preferably a non-orientated film so as to be capable of being obedient to bending.

(1-5 Lamination)

The constituent elements described above are stacked and are pressed under heat and pressure by a vacuum laminator. After that, the backing 1002 is subjected to folding working in the desired shape.

(1-6 Junction Box)

The materials for the junction box 1005 is selected from Noryl, polycarbonate, polyamide, polyacetal, modified PPO, polyester, polyarylate, unsaturated polyester, phenolic resin, epoxy resin, engineering plastics, ABS resin, PP, PVC, and so on.

For preventing electric leakage, the inside of the junction box 1005 is filled with a material selected from epoxy resin based adhesives, silicone based potting agents, silicone based adhesive sealing agents, silicone one-part type RTV rubber, and so on.

2. Members Related to Mounting

The members related to mounting include the rafters 206, sheathing roof boards 207, joint drip plates 210, joint covers 214, retaining clips 208, and eave arabesque 209 as shown in FIG. 3, and the wiring receiving portion covers 214 and finish covers 215 as shown in FIG. 5.

(2-1 Rafters)

The well-known rafters of timber material, steel frame, or the like are used.

(2-2 Sheathing Roof Boards)

The material for the sheathing roof boards may be any material normally used for the roof, such as flat wood sheathing roof boards, mortar, cemented excelsior board, plywood, or cemented chip. A heat insulating material such as polystyrene foam, polyurethane foam, polyethylene foam, glass wool, or insulation board may also be used together with the foregoing materials, which is effective to recover degradation of performance of amorphous silicon solar battery when the roof members are heated. In addition, a moisture-resistant material, heat-insulating foam, or the like may be laid over such sheathing roof boards.

(2-3 Joint Drip Plate)

The material for the joint drip plates may be selected from the same materials as those for the combination roof member and solar battery or for the backing of the roof member as described previously, such as the steel sheets and non-ferrous metal plates. The joint drip plates are preferably provided with the waterproofing seals for preventing water from leaking to the sheathing roof board. The joint drip plates and joint covers may be omitted if flashing is effected by also overlapping and engaging the solar battery modules with each other horizontally.

(2-4 Joint Cover, Wiring Receiving Portion Cover, and Finish Cover)

The materials for these members may also be selected from the materials described previously. The joint covers, however, need to be bent and unbent readily at the edge thereof.

(2-5 Retaining Clip and Eave Arabesque)

These members may be selected from the well-known ones.

<Embodiment 2>

When only the cables and connectors are placed in the wiring receiving portion without positioning the junction boxes in the wiring receiving portion, the electrical connection can be made readily in the ridge-to-eaves direction. The present embodiment is constructed substantially in the same structure as Embodiment 1 except that the position of the junction box is changed.

Figure 6:
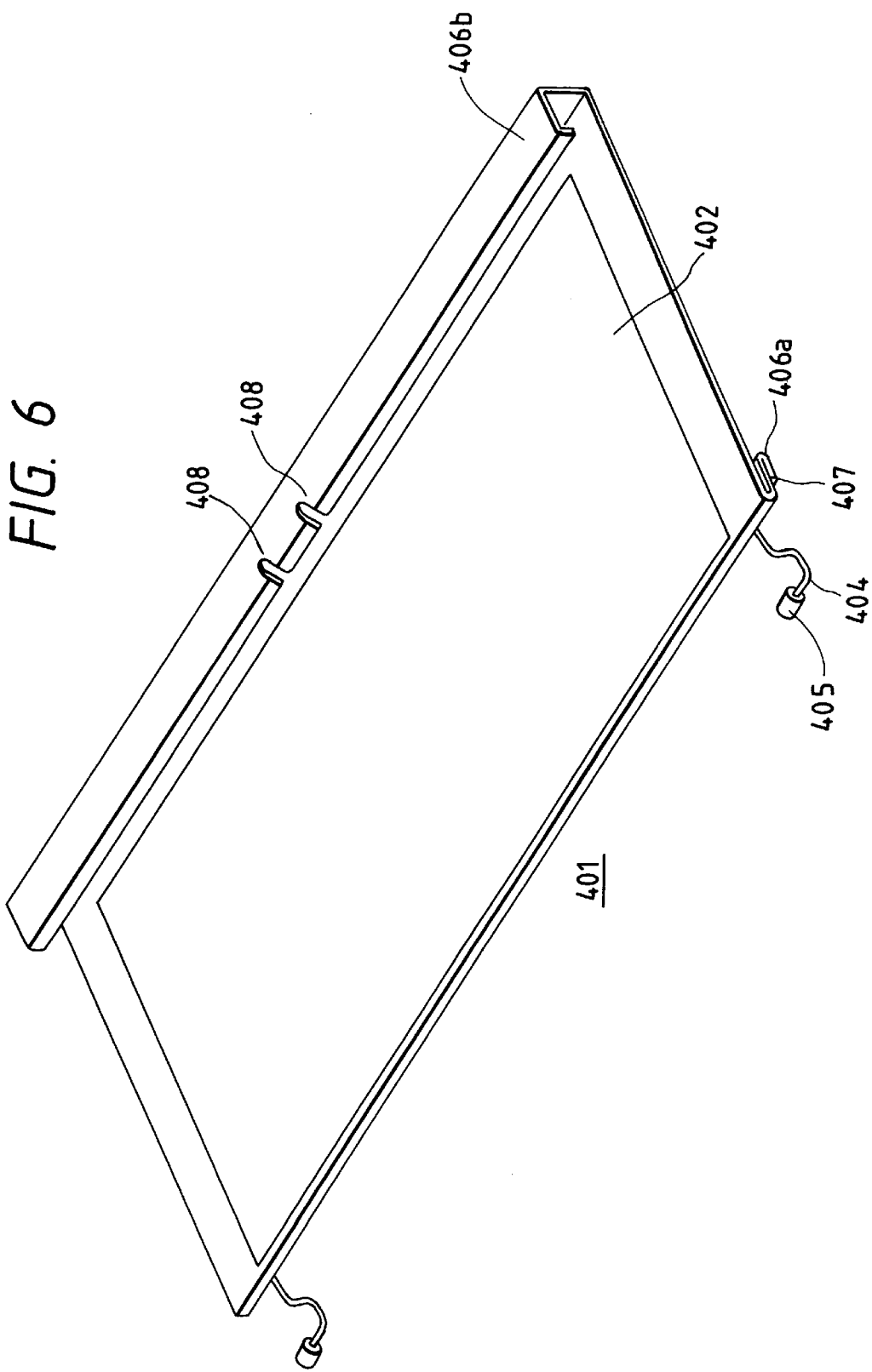
FIG. 6 is a drawing to show an appearance of the front surface of the roof member of Embodiment 2.
Figure 7:
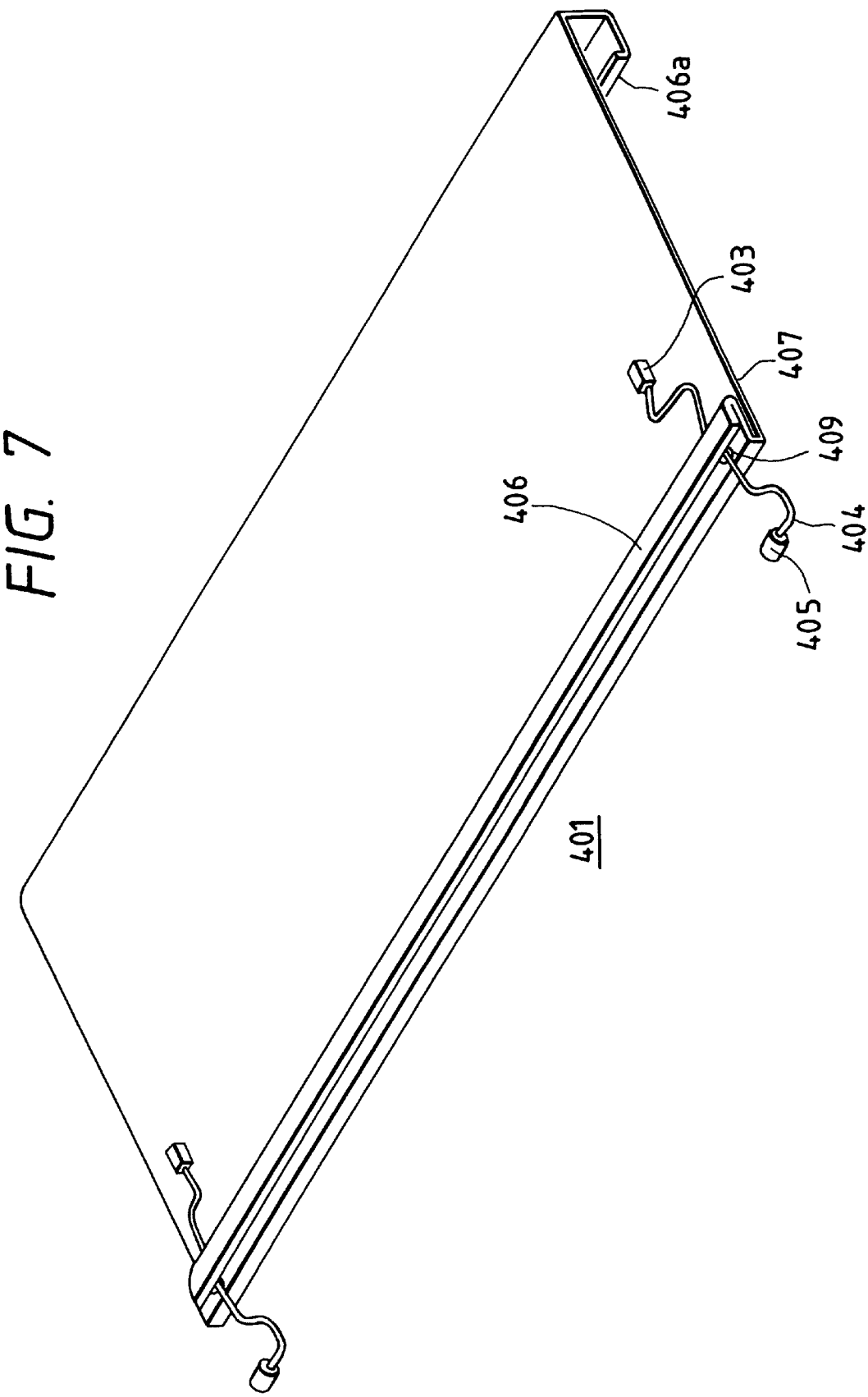
FIG. 7 is a drawing to show the appearance of the back surface of the roof member of Embodiment 2.

FIG. 6 and FIG. 7 are views to show appearances of the front surface and the back surface, respectively, of the roof member of the present embodiment.

As seen in FIG. 7 of the back surface, the junction boxes 403 in the present embodiment are positioned on the back side opposite to the surface of the solar battery element 402 of the roof member 401.

The cable 404 drawn out of each junction box 403 is put into a through hole 409 formed in the connecting portion located on the eaves side of the roof member 401 to be guided into the wiring receiving portion. The through hole 409 provided in the connecting portion is sealed by silicone sealant, for preventing leaking of rain or the like.

As seen in FIG. 6 of the front surface, the ridge-side connecting portion at the connected position is provided with notches 408, each letting the cable of the roof member adjacent on the ridge side pass into the wiring receiving portion. Similar notches are also given in the wiring receiving portion cover.

A fabrication process of the present embodiment is as follows: the back reinforcing plate is preliminarily processed so as to form through holes at the positions where the junction boxes are bonded and the through holes and notches at the positions where the cables pass; and then the back reinforcing plate is bonded to the solar battery element.

Copper foil for wiring is placed at the positions of the junction boxes placed and on the back surface of the solar battery element.

As for the other points, the present embodiment employs the same materials and the same installation method as in Embodiment 1.

Figure 8:
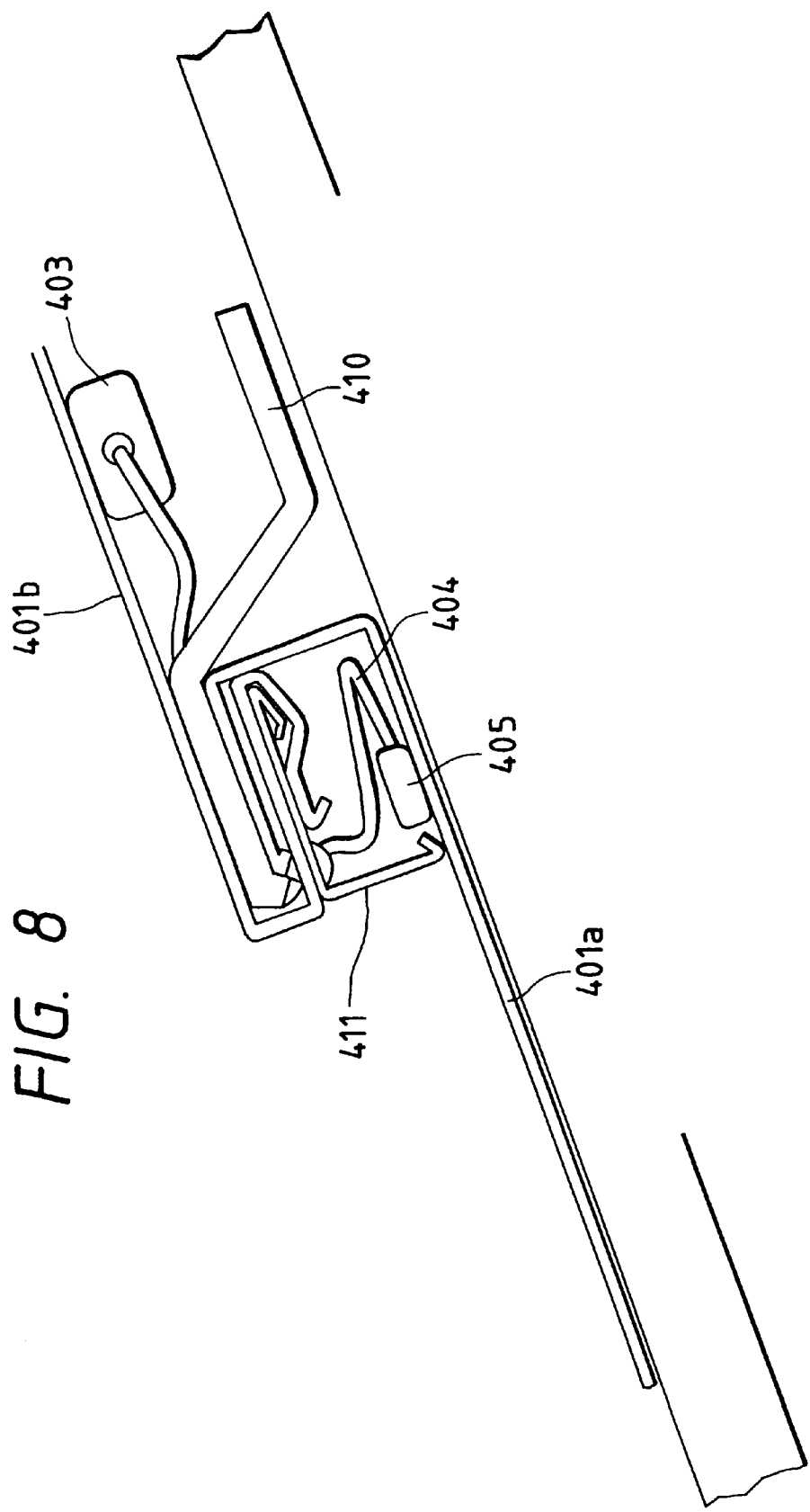
FIG. 8 is a schematic, cross-sectional, structural drawing to show the region near the engaging portions and wiring receiving portion in the roof members of Embodiment 2.

FIG. 8 is a schematic, cross-sectional, structural view near the connecting portions and wiring receiving portion of the roof member according to the present embodiment. The cable 404 connected with each junction box 403 of the ridge-side roof member 401a is routed through the above-stated through hole and notch into the wire receiving portion of the eaves-side roof member 401b. This arrangement achieves connection in the ridge-to-eaves direction.

When the roof members of the present embodiment are used at the roofing end, a string of roof members horizontally connected in series as in Embodiment 1 can be connected in series with another string located further on the ridge side or on the eaves side.

Since in the present embodiment the junction boxes are located at the positions where they are unlikely to be exposed to wind and rain, the present embodiment enables use of large-scale junction boxes and cheap junction boxes. Since the wiring receiving portion can be made in a small capacity, the present embodiment can adapt to a variety of designs.

What is claimed is:

1. A solar battery module comprising:

a solar battery;

a support, on which said solar battery is mounted, having first and second connecting portions at opposing sides for connecting adjacent solar battery modules, with said first connecting portion bent to form a space on a light-receiving surface, the space having an opening to permit electrical wiring for electrical connection to be inserted and removed in the direction perpendicular to a bent side of said first connecting portion, and said second connecting portion bent to a surface opposite to the light-receiving surface; and electrical wiring for electrical connection provided in the space.

2. A solar battery module according to claim 1, said solar battery module having a backing, a filling material, a solar battery element, a surface film, and an output drawing portion.

3. A solar battery module according to claim 2, wherein said output drawing portion is provided in said first connecting portion.

4. A solar battery module according to claim 2, wherein said output drawing portion is provided on a back surface of said backing.

5. A solar battery module according to claim 4, wherein said second connecting portion has a through hole for letting a wire from said output drawing portion pass, and wherein said first connecting portion has a notch for letting a wire from another solar battery module adjacent to said first connecting portion pass.

6. A solar battery module according to claim 5, wherein the through hole is sealed by a sealant.

7. A solar battery module according to claim 2, wherein said solar battery element is an amorphous silicon solar cell.

8. A solar battery module according to claim 7, wherein said amorphous silicon solar cell has at least a substrate, a metal layer, a semiconductor layer, a transparent electrode, and a collector electrode.

9. A solar battery module according to claim 2, wherein said solar battery element contains germanium and/or carbon.

10. A solar battery module according to claim 2, wherein said backing is a metal plate.

11. A solar battery module according to claim 1, further comprising a cover for covering an opening of said first connecting portion.

12. A solar battery module according to claim 2, wherein an inside of said output drawing portion is filled with an electric insulator.

13. A solar battery module according to claim 2, further comprising an electric insulator between said backing and said solar battery element.

14. A solar battery module according to claim 1, wherein an inside or a surface of said filling material has a nonwoven glass fabric.

15. A roof member comprising:
a solar battery;
a support, on which said solar battery is mounted, having first and second connecting portions at opposing sides for connecting adjacent solar battery modules, with said first connecting portion bent to form a space on a light-receiving surface, the space having an opening to permit electrical wiring for electrical connection to be inserted and removed in the direction perpendicular to a bent side of said first connecting portion, and said second connecting portion bent to a surface opposite to the light-receiving surface; and
electrical wiring for electrical connection provided in the space, wherein
said first connecting portion of said support is connectable to a second connecting portion of an adjacent roof member.

16. A roof member according to claim 15, said solar battery module having a backing, a filling material, a solar battery element, a surface film, and an output drawing portion.

17. A roof member according to claim 16, wherein said output drawing portion is provided in said first connecting portion.

18. A roof member according to claim 16, wherein said output drawing portion is provided on a back surface of said backing.

19. A roof member according to claim 18, wherein said second connecting portion has a through hole for letting a wire from said output drawing portion pass and wherein said first connecting portion has a notch for letting a wire from another solar battery module adjacent to said first connecting portion pass.

20. A roof member according to claim 19, wherein the through hole is sealed by a sealant.

21. A roof member according to claim 16, wherein said solar battery element is an amorphous silicon solar cell.

22. A roof member according to claim 21, wherein said amorphous silicon solar cell has at least a substrate, a metal layer, a semiconductor layer, a transparent electrode, and a collector electrode.

23. A roof member according to claim 16, wherein said solar battery element contains germanium and/or carbon.

24. A roof member according to claim 16, wherein said backing is a metal plate.

25. A roof member according to claim 15, further comprising a cover for covering an opening of said first connecting portion.

26. A roof member according to claim 16, wherein an inside of said output drawing portion is filled with an electric insulator.

27. A roof member according to claim 15, further comprising an electric insulator between said backing and said solar battery element.

28. A roof member according to claim 15, wherein an inside or a surface of said filling material has a nonwoven glass fabric.

29. A method of mounting a roof member having a solar battery element and first and second connecting portions, with the first connecting portion bent to form a space on a light-receiving surface of the roof member, the space having an opening to permit electrical wiring for electrical connection to be inserted and removed in the direction perpendicular to a bent side of said first connecting portion, and the second connecting portion bent toward a surface opposite to the light-receiving surface so as to be able to connect edge portions of adjacent roof members to each other, the method comprising the steps of:
positioning the first connecting portion on a ridge-side of the roof member;
positioning the second connecting portion on an eaves-side of the roof opposite to the ridge-side to connect an adjacent roof member; and
placing electrical wiring for an electrical connection in the space.

30. A roof comprising:
a plurality of roof members each comprising a solar battery element and first and second connecting portions opposingly provided so as to be able to connect edge portions of adjacent roof member to each other, with said first connecting portions bent to form a space on a light-receiving surface, the space having an opening to permit electrical wiring for electrical connection to be inserted and removed in the direction perpendicular to a bent side of said first connecting portion, and said second connecting portion bent on a surface opposite to the light-receiving surface;
an electrical wiring for electrical connection provided in the space, wherein
said first connecting portion of a first roof member in which said electrical wiring is provided in the space is placed on a ridge side, and wherein said second connecting portion of a second roof member is placed on an eaves side to connect said first and second roof members to each other; and
a joint cover to house the electrical wiring in the space.

31. A roof according to claim 30, said solar battery module having a backing, a filling material, a solar battery element, a surface film, and an output drawing portion.

32. A roof according to claim 31, wherein said output drawing portion is provided in said ridge-side connecting portion.

33. A roof according to claim 31, wherein said output drawing portion is provided on a back surface of said backing.

34. A roof according to claim 33, wherein said eaves-side connecting portion has a through hole for letting a wire from said output drawing portion pass and wherein said ridge-side connecting portion has a notch for letting a wire from another solar battery module adjacent on said ridge-side pass.

35. A roof according to claim 34, wherein said through hole is sealed by a sealant.

36. A roof according to claim 31, wherein said solar battery element is an amorphous silicon solar cell.

37. A roof according to claim 36, wherein said amorphous silicon solar cell has at least a substrate, a metal layer, a semiconductor layer, a transparent electrode, and a collector electrode.

38. A roof according to claim 31, wherein said solar battery element contains germanium and/or carbon.

39. A roof according to claim 31, wherein said backing is a metal plate.

40. A roof according to claim 30, further comprising a cover for covering an opening of said ridge-side connecting portion.

41. A roof according to claim 31, wherein an inside of said output drawing portion is filled with an electric insulator.

42. A roof according to claim 30, further comprising an electric insulator between said backing and said solar battery element.

43. A roof according to claim 30, wherein an inside or a surface of said filling material has a nonwoven glass fabric.

44. A solar battery module comprising:
   a solar battery;
   a support, on which said solar battery is mounted, having first and second connecting portions at opposing sides for connecting adjacent solar battery modules, with said first connecting portion bent to form a space on a light-receiving surface, the space having an opening for wiring in the direction perpendicular to a bent side of said first connecting portion, and said second connecting portion bent to a surface opposite to the light-receiving surface; and
   electrical wiring for electrical connection provided in the space.

45. A solar battery module according to claim 44, said solar battery module having a backing, a filling material, a solar battery element, a surface film, and an output drawing portion.

46. A solar battery module according to claim 45, wherein said output drawing portion is provided in said first connecting portion.

47. A solar battery module according to claim 45, wherein said output drawing portion is provided on a back surface of said backing.

48. A solar battery module according to claim 47, wherein said second connecting portion has a through hole for letting a wire from said output drawing portion pass, and wherein said first connecting portion has a notch for letting a wire from another solar battery module adjacent to said first connecting portion pass.

49. A solar battery module according to claim 48, wherein the through hole is sealed by a sealant.

50. A solar battery module according to claim 45, wherein said solar battery element is an amorphous silicon solar cell.

51. A solar battery module according to claim 50, wherein said amorphous silicon solar cell has at least a substrate, a metal layer, a semiconductor layer, a transparent electrode, and a collector electrode.

52. A solar battery module according to claim 45, wherein said solar battery element contains germanium and/or carbon.

53. A solar battery module according to claim 45, wherein said backing is a metal plate.

54. A solar battery module according to claim 44, further comprising a cover for covering an opening of said first connecting portion.

55. A solar battery module according to claim 45, wherein an inside of said output drawing portion is filled with an electric insulator.

56. A solar battery module according to claim 45, further comprising an electric insulator between said backing and said solar battery element.

57. A solar battery module according to claim 44, wherein an inside or a surface of said filling material has a nonwoven glass fabric.

58. A roof member comprising:
   a solar battery;
   a support, on which said solar battery is mounted, having first and second connecting portions at opposing sides for connecting adjacent solar battery modules, with said first connecting portion bent to form a space on a light-receiving surface, the space having an opening for wiring in the direction perpendicular to a bent side of said first connecting portion, and said second connecting portion bent to a surface opposite to the light-receiving surface; and
   electrical wiring for electrical connection provided in the space, wherein
   said first connecting portion of said support is connectable to a second connecting portion of an adjacent roof member.

59. A roof member according to claim 58, said solar battery module having a backing, a filling material, a solar battery element, a surface film, and an output drawing portion.

60. A roof member according to claim 59, wherein said output drawing portion is provided in said first connecting portion.

61. A roof member according to claim 59, wherein said output drawing portion is provided on a back surface of said backing.

62. A roof member according to claim 61, wherein said second connecting portion has a through hole for letting a wire from said output drawing portion pass, and wherein said first connecting portion has a notch for letting a wire from another solar battery module adjacent to said first connecting portion pass.

63. A roof member according to claim 62, wherein the through hole is sealed by a sealant.

64. A roof member according to claim 59, wherein said solar battery element is an amorphous silicon solar cell.

65. A roof member according to claim 64, wherein said amorphous silicon solar cell has at least a substrate, a metal layer, a semiconductor layer, a transparent electrode, and a collector electrode.

66. A roof member according to claim 59, wherein said solar battery element contains germanium and/or carbon.

67. A roof member according to claim 59, wherein said backing is a metal plate.

68. A roof member according to claim 58, further comprising a cover for covering an opening of said first connecting portion.

69. A roof member according to claim 59, wherein an inside of said output drawing portion is filled with an electric insulator.

70. A roof member according to claim 58, further comprising an electric insulator between said backing and said solar battery element.

71. A roof member according to claim 58, wherein an inside or a surface of said filling material has a nonwoven glass fabric.

72. A method of mounting a roof member having a solar battery element and first and second connecting portions, with the first connecting portion bent to form a space on a light-receiving surface of the roof member, the space having an opening for wiring in the direction perpendicular to a bent side of said first connecting portion, and the second connecting portion bent toward a surface opposite to the light-receiving surface so as to be able to connect edge portions of adjacent roof members to each other, the method comprising the steps of:
   positioning the first connecting portion on a ridge-side of the roof member;

positioning the second connecting portion on an eaves-side of the roof opposite to the ridge-side to connect an adjacent roof member; and placing electrical wiring for an electrical connection in the space.

73. A roof comprising:

a plurality of roof members each comprising a solar battery element and first and second connecting portions opposingly provided so as to be able to connect edge portions of adjacent roof members to each other, with said first connecting portions bent to form a space on a light-receiving surface, the space having an opening for wiring in the direction perpendicular to a bent side of said first connecting portion, and said second connecting portion bent on a surface opposite to the light-receiving surface;

an electrical wiring for electrical connection provided in the space, wherein said first connecting portion of a first roof member in which said electrical wiring is provided in the space is placed on a ridge side, and wherein said second connecting portion of a second roof member is placed on an eaves side to connect said first and second roof members to each other; and a joint cover to house the electrical wiring in the space.

74. A roof according to claim 73, said solar battery module having a backing, a filling material, a solar battery element, a surface film, and an output drawing portion.

75. A roof according to claim 74, wherein said output drawing portion is provided in said ridge-side connecting portion.

76. A roof according to claim 74, wherein said output drawing portion is provided on a back surface of said backing.

77. A roof according to claim 76, wherein said eaves-side connecting portion has a through hole for letting a wire from said output drawing portion pass and wherein said ridge-side connecting portion has a notch for letting a wire from another solar battery module adjacent on said ridge-side pass.

78. A roof according to claim 77, wherein said through hole is sealed by a sealant.

79. A roof according to claim 74, wherein said solar battery element is an amorphous silicon solar cell.

80. A roof according to claim 79, wherein said amorphous silicon solar cell has at least a substrate, a metal layer, a semiconductor layer, a transparent electrode, and a collector electrode.

81. A roof according to claim 74, wherein said solar battery element contains germanium and/or carbon.

82. A roof according to claim 74, wherein said backing is a metal plate.

83. A roof according to claim 73, further comprising a cover for covering an opening of said ridge-side connecting portion.

84. A roof according to claim 74, wherein an inside of said output drawing portion is filled with an electric insulator.

85. A roof according to claim 73, further comprising an electric insulator between said backing and said solar battery element.

86. A roof according to claim 73, wherein an inside or a surface of said filling material has a nonwoven glass fabric.

* * * * *

UNITED STATES PATENT AND TRADEMARK OFFICE
CERTIFICATE OF CORRECTION

PATENT NO. : 6,128,868
DATED : October 10, 2000
INVENTOR(S) : Takashi Ohtsuka, et al.

It is certified that error appears in the above-identified patent and that said Letters Patent is hereby corrected as shown below:

Column 10,
Line 18, "member" should read -- members --.

Signed and Sealed this

Sixteenth Day of October, 2001

Attest:

*Nicholas P. Godici*

NICHOLAS P. GODICI
*Attesting Officer*   *Acting Director of the United States Patent and Trademark Office*